United States Patent [19]

Takenaka et al.

[11] Patent Number: 5,362,683
[45] Date of Patent: Nov. 8, 1994

[54] METHOD OF MAKING EPITAXIAL WAFERS

[75] Inventors: Takao Takenaka, Annaka; Masahisa Endo, Gunma; Masato Yamada, Annaka, all of Japan

[73] Assignee: Shin-Etsu Handotai Co., Ltd., Tokyo, Japan

[21] Appl. No.: 205,558

[22] Filed: Mar. 4, 1994

[30] Foreign Application Priority Data

Mar. 10, 1993 [JP] Japan ................... 5-076341

[51] Int. Cl.$^5$ ......................... H01L 21/302
[52] U.S. Cl. ................. 437/226; 437/130; 117/54; 117/60; 117/915
[58] Field of Search ............... 156/254; 148/DIG. 18; 437/226, 130; 117/60, 54, 915

[56] References Cited

U.S. PATENT DOCUMENTS

| | | | |
|---|---|---|---|
| 4,200,484 | 4/1980 | Glass | 117/60 |
| 4,261,781 | 4/1981 | Edmonds et al. | 156/254 |
| 4,300,160 | 11/1981 | Koike et al. | 437/130 |
| 4,315,477 | 2/1982 | Wang et al. | 437/130 |
| 4,675,207 | 6/1987 | Nicolan | 117/6 |
| 5,073,517 | 12/1991 | Iwabuchi et al. | 437/153 |
| 5,240,882 | 8/1993 | Satoh et al. | 437/226 |

Primary Examiner—R. Bruce Breneman
Assistant Examiner—Ramamohan Rao Paladugu
Attorney, Agent, or Firm—Ronald R. Snider

[57] ABSTRACT

To manufacture epitaxial wafers with a smaller amount of semiconductor crystals at a lower cost by means of an efficient epitaxial growth process. An epitaxial wafer is made by forming, by means of epitaxial growth, GaAlAs layers with identical structures on both sides of a GaAs substrate wafer with the crystal plane orientation of {100}. The epitaxial wafer is then divided in the GaAs substrate wafer portion into two pieces to obtain two epitaxial wafers. To perform the epitaxial growth process, a plurality of GaAs substrate wafers are held at their edges and then the GaAs substrate wafers are placed in a Ga solution at prescribed spatial intervals. To divide the epitaxial wafer in the GaAs substrate portion into two pieces, the substrate wafer portion is cut parallel to the main surface. Or, the GaAs substrate wafer can also be removed by means of etching while the epitaxial wafer is rotated at a high speed in the etching solution.

8 Claims, 4 Drawing Sheets

F I G. 1
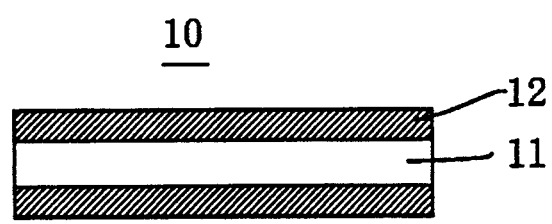
F I G. 2
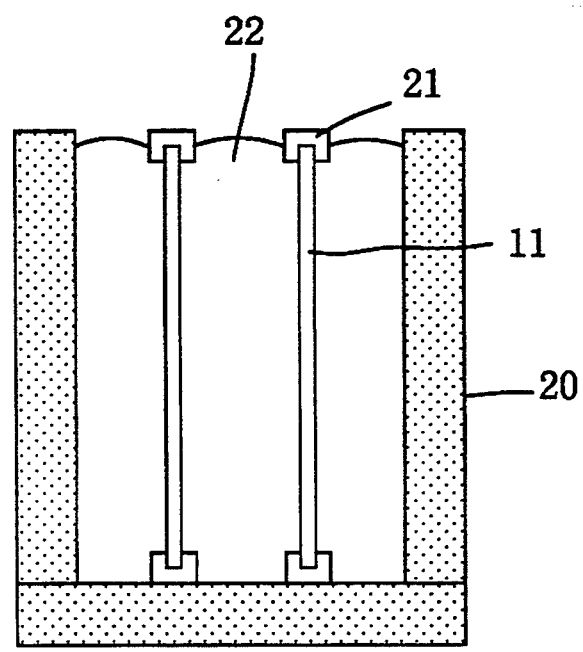

F I G. 7
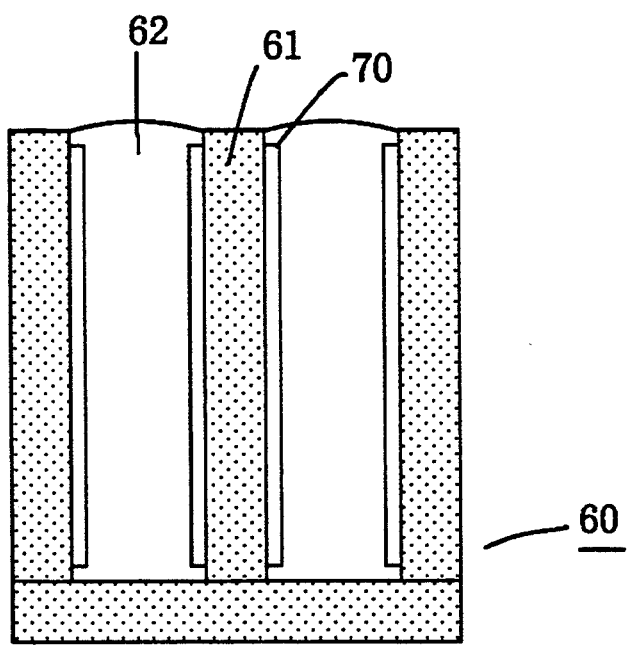

METHOD OF MAKING EPITAXIAL WAFERS

BACKGROUND OF THE INVENTION

1. Field of the Invention

This invention relates to an epitaxial wafer and methods of manufacturing it. More precisely, this invention relates to an epitaxial wafer used in light emitting elements such as light emitting diodes, and methods of manufacturing it.

2. The Prior Art

Light emitting elements, such as light emitting diodes, are obtained by laminating semiconductor layers on top of a semiconductor single crystal substrate (hereafter referred to as "substrate wafer") to fabricate a semiconductor substrate with a pn junction and then making it into an element(s). For example, GaAlAs light emitting elements are manufactured by using an epitaxial wafer obtained by forming, by means of epitaxial growth, a p-type GaAlAs clad layer, a p-type GaAlAs active layer and a n-type GaAlAs clad layer (hereafter, these are generically referred to as "GaAlAs layers") one after another on a p-type GaAs substrate.

The following process, for example, has been conventionally employed to manufacture the GaAlAs epitaxial wafers as described above with the liquid phase epitaxial method. As shown in FIG. 7, wafer holders 61 on which p-type GaAs substrate wafers 70 are stuck are placed in a parallel fashion at prescribed intervals in the carbon container 60, then this container 60 is filled with the Ga solution 62 in which Al and GaAs crystals are dissolved, and the temperature is lowered at a prescribed rate to obtain epitaxial growth layers of GaAlAs on the p-type GaAs substrate wafers 70.

The GaAs substrate wafer portion of the epitaxial wafer thus obtained is eventually either partially removed to have a prescribed thickness or completely removed, by means of etching and such. That is, the epitaxial wafer described above needs enough strength to survive various treatments during the epitaxial wafer manufacturing process, and the GaAs substrate wafer provides that strength. Therefore, at the final stage after the treatments, the presence of the GaAs substrate wafer is not necessarily required.

For example, when manufacturing light emitting elements which are not required to have a very high luminance, relatively thin, 10–50 micrometers, GaAlAs layers are formed on the GaAs substrate wafer, and eventually a prescribed thickness from the GaAs substrate side is lapped and/or etched away to adjust the total thickness. When manufacturing light emitting elements which are required to have a high luminance, thick GaAlAs layers, about 200 micrometers for example, are formed on the GaAs substrate wafer, and eventually the GaAs substrate wafer is completely removed by means of lapping and/or etching.

However, in conventional methods such as the one described above, a substantial portion of the semiconductor single crystal which was the material of the substrate wafer was wasted, causing higher costs. That is, a substrate wafer of a thickness of approximately 300 micrometers was usually used to guarantee the substrate strength during the epitaxial wafer manufacturing process. However, since the wafer strength was not needed as much after the epitaxial layers are formed on the substrate wafer, the substrate wafer was eventually lapped and/or etched down to a prescribed thickness or completely removed by means of lapping and/or etching. Therefore, that amount of semiconductor single crystal ingot (hereafter referred to as "crystal") was wasted.

Also, there was a productivity problem in that the number of wafer holders which can be placed in said container was limited and therefore the number of substrate wafers to be treated in one epitaxial growth process was limited in the epitaxial growth process described above, wherein the epitaxial growth process was conducted in a container accommodating a plurality of wafer holders onto which the substrate wafers were stuck. It was also time consuming to stick the substrate wafers onto the wafer holders.

BRIEF DESCRIPTION OF INVENTION

The object of this invention is to provide an epitaxial wafer which requires smaller amounts of the materials, i.e. semiconductor single crystals used to manufacture the substrate wafers, and can be manufactured at a lower cost by means of an efficient epitaxial growth process, as well as methods of manufacturing it.

This invention provides an epitaxial wafer comprising epitaxial growth layers with identical structures formed on both sides of a substrate wafer.

The substrate wafer is composed of, for example, GaAs compound semiconductor; the epitaxial growth layer is composed of, for example, GaAlAs compound semiconductor; and, the crystal plane orientation of said substrate wafer is, for example, {100}.

This invention provides methods of manufacturing epitaxial wafers wherein epitaxial growth layers with identical structures are formed on both sides of a substrate wafer and then the product is divided, with the dividing plane in said substrate wafer parallel to the main surface, into two pieces to obtain two epitaxial wafers.

The process of forming the epitaxial growth layers is, for example, a process in which a plurality of substrate wafers are held at their edges and then placed in an epitaxial growth solution at prescribed spatial intervals. The process of dividing the product in the substrate wafer portion is a process in which said substrate wafer portion is cut along a plane parallel to the main surface, or a process which includes said cutting process followed by a process of removing the rest of the substrate wafer by means of grinding, lapping and/or etching, etc.

The process of cutting the substrate wafer portion is, for example, a process in which the epitaxial wafers which epitaxial growth layers with identical structures have been formed on both sides of substrate wafers are sliced one by one, or sliced after a plurality of them are laminated to form an ingot. The process of dividing the epitaxial wafer(s) which epitaxial growth layers with identical structures have been formed on the both sides of the substrate wafer(s) may be a process in which the epitaxial wafer(s) is rotated at a high speed in an etching solution to remove said substrate wafer(s) by means of etching.

It is also possible to divide said epitaxial wafer in half to obtain two epitaxial wafers, after having performed a photolithographic process to form a prescribed electrode pattern on said epitaxial wafer which epitaxial growth layers with identical structures have been formed on both sides of the substrate wafer.

In this invention, it is possible to form epitaxial growth layers with identical structures on both sides of the substrate wafer and divide the product, with the dividing plane in this substrate wafer parallel to the main surface, into two pieces to obtain two epitaxial wafers. To accomplish the division-in-half in the substrate wafer by means of slicing and such, the substrate wafer has to be thicker by the amount needed for the dividing process. However, the thickness (including the crystal loss in manufacturing the substrate wafer (hereafter referred to as "wafer processing loss")) of the crystal required to obtain one substrate wafer used for manufacturing one double-sided epitaxial wafer (which eventually turns into two final epitaxial wafers) is less than the thickness of the crystal required to obtain two substrate wafers on which the conventional one-sided epitaxial growth is performed.

For example, when a 300 micrometer thick substrate wafer was required to ensure strength, an approximately 650 micrometer thick crystal was required per wafer in the conventional method, taking into account the thickness of approximately 350 micrometers of wafer processing loss per wafer. To obtain two epitaxial wafers, a crystal of a total thickness of approximately 1300 micrometers was required.

On the other hand, according to this invention, when the substrate wafer is to be completely removed in the end, the required thickness of the crystal is a sum of the thickness for the wafer processing loss and the thickness for the dividing loss. The actual thickness for the wafer processing loss is, since double-sided polishing is to be performed, approximately 400 micrometers, which is a little thicker than the thickness for the conventional method in which single-sided polishing is performed. Likewise, the actual dividing loss is approximately 400 micrometers. Therefore, the required crystal thickness in this case is approximately 800 micrometers. A substrate thickness of 400 micrometers, which is the thickness for the dividing loss, is maintained until the division, ensuring enough substrate strength.

When 200 micrometers of the substrate wafer is to be left at the end, a total of 400 micrometers for two wafers should be added to the thickness mentioned above. Therefore, the required thickness for the crystal in this case is approximately 1200 micrometers.

Since epitaxial growth layers with identical structures are formed on both sides of one substrate wafer in this invention, the epitaxial growth process can be performed very efficiently. In other words, whereas the epitaxial growth has conventionally taken place on one side of the substrate wafer by sticking a substrate wafer on each wall of a plurality of wafer holders, the epitaxial growth in this invention takes place on both sides of the substrate wafer. Furthermore, space for said wafer holders to stick substrate wafers on is now freed so more substrate wafers can be placed for the epitaxial growth, and therefore twice or more of the epitaxial wafers can be obtained at the end. The actual process would be, for example, a process in which a plurality of substrate wafers are held at their edges and then placed in an epitaxial growth solution at prescribed spatial intervals. The double-sided growth is thus accomplished.

In order for the epitaxial growth to take place under the same conditions on both sides of a substrate wafer, it is preferable to use the crystal plane orientation of {100} for the substrate wafer.

BRIEF DESCRIPTION OF THE DRAWINGS

FIG. 1 is an explanatory illustration of an epitaxial wafer of the example of this invention.

FIG. 2 is an explanatory illustration which shows a process of manufacturing the epitaxial wafers of the example of this invention by means of the liquid phase epitaxial growth method.

FIG. 7 is an explanatory illustration which shows a conventional process for manufacturing epitaxial wafers.

DETAILED DESCRIPTION

Figure 3:
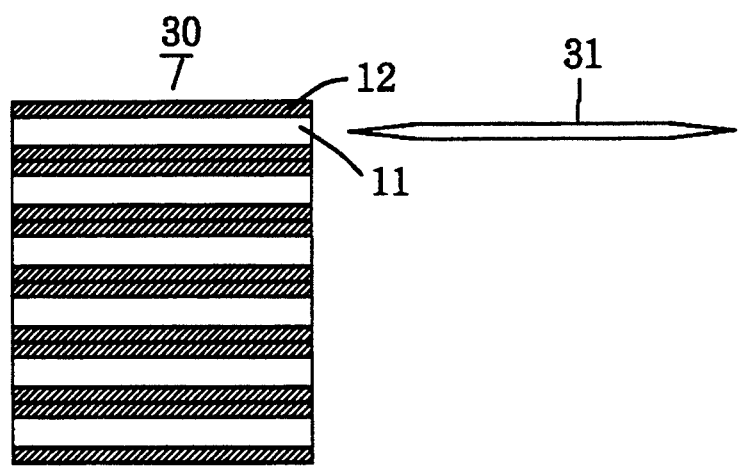
FIG. 3 is an explanatory illustration which shows a process of laminating the epitaxial wafers of the example of this invention and slicing them.

An example of this invention is described below by referring to the Figures. FIG. 1 shows the epitaxial wafer 10 of this invention. This epitaxial wafer 10 is made by forming GaAlAs layers 12 with identical structures on both sides of a p-type GaAs substrate wafer 11 with the crystal plane orientation of {100}. The GaAlAs layers 12 are a p-type GaAlAs clad layer, a p-type GaAlAs active layer and a n-type GaAlAs clad layer from the substrate wafer side. The thickness of the GaAs substrate wafer 11 should be more than the thickness for the loss during the cutting process which is to be performed later. The actual thickness should be approximately 400 micrometers.

FIG. 2 shows the process in which the GaAlAs layers 12 are formed on both sides of the GaAs substrate wafers 11 by means of the liquid epitaxial growth method. The wafer holders 21 which hold a plurality of the GaAs substrate wafers 11 at their edges are installed in the carbon container 20 used for this growth process. These wafer holders 21 support the GaAs substrate wafers 11 parallel to each other with both their sides exposed. The container 20 is then filled with the Ga solution 22 to perform the liquid phase epitaxial growth. Thus, the epitaxial wafers 10 which the GaAlAs layers 12 are formed on the both sides of the GaAs substrate wafers, as shown in FIG. 1, is obtained.

Next, said epitaxial wafer 10 which the GaAlAs layers 12 with identical structures have been formed on the both sides of the substrate wafer is divided into two pieces and finally the GaAs substrate wafer 11 is removed to obtain two epitaxial wafers (the GaAlAs layers) 12. In this process, first the GaAs substrate wafer 11 portion of the epitaxial wafer 10 is cut parallel to the main surface. For example, as shown in FIG. 3, a plurality of epitaxial wafers 10 are stuck together by using paraffin and such to form an ingot 30, and then a slicer is used to cut it at the GaAs substrate wafer 11 portions, one after another, to obtain, as shown in FIG. 4, the epitaxial wafers 40 each of which has the GaAlAs layers 12 on one side.

Figure 4:
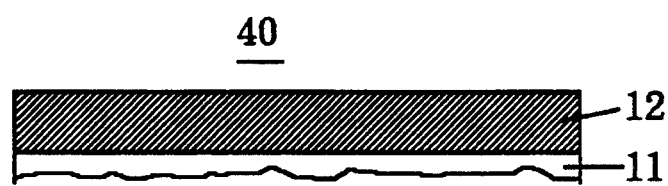
FIG. 4 is an explanatory illustration which shows the epitaxial wafer with the epitaxial Growth layer on one side which is obtained by the cutting process shown in FIG. 3.
Figure 5:
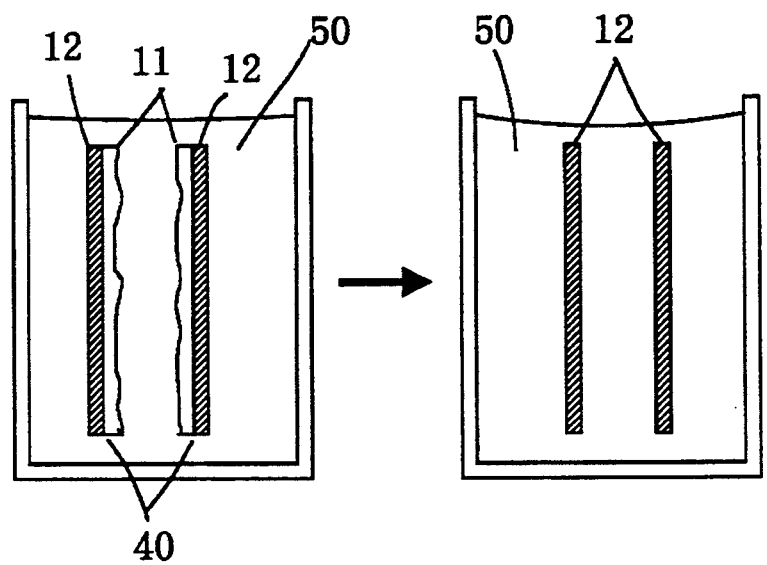
FIG. 5 is an explanatory illustration which shows a process of removing, by means of etching, the residual GaAs substrate wafers of the epitaxial wafers in FIG. 4.

As shown in FIG. 4, the epitaxial wafer 40 still has the GaAs substrate wafer 11 remaining after the cutting process, and therefore, as shown in FIG. 5, the epitaxial wafers 40 are immersed in an etching solution 50 to completely remove the remaining GaAs substrate wafers 11. For such a etching solution, a mixed solution of a 30% ammonia aqueous solution and 30% hydrogen peroxide at a mixing ratio of 1:10 to 1:100, for example, can be used. This removal of the GaAs substrate wafer can also be done by a combination of said etching process and grinding and/or lapping.

Figure 6:
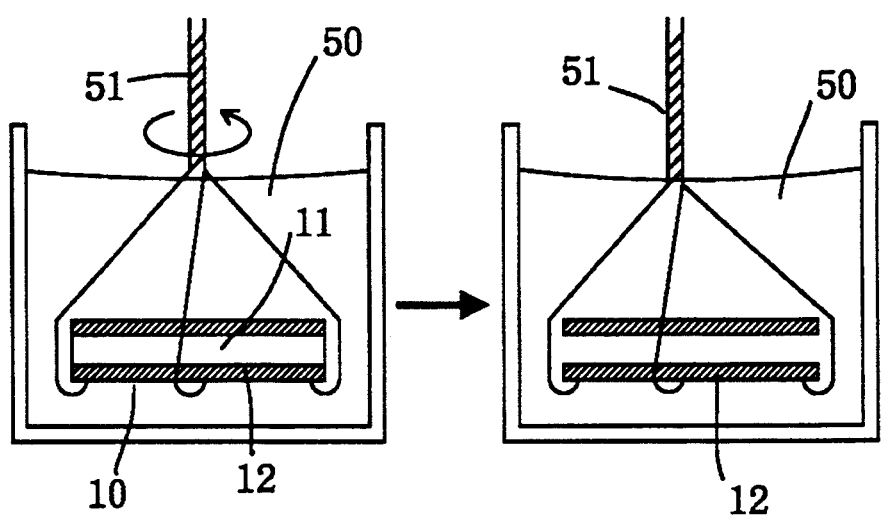
FIG. 6 is an explanatory illustration which shows a process of removing, by means of etching, the GaAs substrate wafer while rotating the epitaxial wafer of the example of this invention at a high speed.

For another method of dividing the epitaxial wafer which the epitaxial growth has been performed on the both sides of the substrate wafer into two pieces, the GaAs substrate wafer 11 portion can be removed by just an etching process, instead of using a combination of the cutting process with a slicer and the etching process and such as described above. In this case, as shown in FIG. 6, it is preferable to accelerate the etching rate by rotating the epitaxial wafer(s) 10 at a high speed by using the fixture 51 which holds the wafer in such a way that it can rotate, because it takes a substantial amount of time to completely remove the GaAs substrate wafer 11 by etching the epitaxial wafer 10 with the common immersion method as shown in FIG. 5.

The epitaxial wafer from which the GaAs substrate wafer has been removed, as described above, is then treated with the element forming process to obtain light emitting elements. It is also possible to treat the epitaxial wafer 10 which the GaAlAs layers 12 have been formed on both sides of the GaAs substrate wafer with the element forming process (photolithography process), and then, after the photolithography process, to divide it into two pieces.

As described above, this invention allows a drastic reduction in the amount of semiconductor single crystals which are the material and also allows lower manufacturing costs of the epitaxial wafers with an efficient epitaxial growth process.

We claim:

1. A method of manufacturing epitaxial wafers wherein epitaxial growth layers with identical structures are formed on both sides of semiconductor single crystal substrates and then the epitaxial wafer is divided, with the dividing plane in said semiconductor single crystal substrate portion parallel to the main surface, into two pieces to obtain two epitaxial wafers.

2. A method of manufacturing epitaxial wafers as described in claim 1, wherein said epitaxial growth layers are formed in a process in which a plurality of semiconductor single crystal substrates are held at their edges and then placed in an epitaxial growth solution at prescribed spatial intervals.

3. A method of manufacturing epitaxial wafers as described in claim 1, wherein said dividing is a cutting process in which said semiconductor single crystal substrate portion is cut along a plane parallel to the main surface, or a process which includes said cutting process followed by a process of removing the rest of the semiconductor single crystal substrate.

4. A method of manufacturing epitaxial wafers as described in claim 3, wherein said process of cutting the semiconductor single crystal substrate portion is a process in which said epitaxial wafers which epitaxial growth layers with identical structures have been formed on both sides of said substrates are sliced one by one, or sliced after a plurality of them are laminated to form an ingot.

5. A method of manufacturing epitaxial wafers as described in claim 1, wherein said dividing process is a process in which said epitaxial wafer(s) which epitaxial growth layers with identical structures have been formed on both sides of semiconductor single crystal substrate is rotated at a high speed in an etching solution to remove said semiconductor single crystal substrate by means of etching.

6. A method of manufacturing epitaxial wafers as described in claim 1, wherein said semiconductor single crystal substrate is composed of GaAs compound semiconductor and said epitaxial growth layers are composed of GaAlAs compound semiconductor.

7. A method of manufacturing epitaxial wafers as described in claim 1, wherein the crystal plane orientation of said semiconductor single crystal substrate is {100}.

8. A method of manufacturing epitaxial wafers as described in claim 1, wherein after a photolithographic process is performed to form a prescribed electrode pattern on said epitaxial wafer which epitaxial growth layers with identical structures have been formed on both sides of the semiconductor single crystal substrate, said epitaxial wafer is divided in half to obtain two epitaxial wafers.

* * * * *